(12) United States Patent
Das et al.

(10) Patent No.: US 8,390,954 B2
(45) Date of Patent: Mar. 5, 2013

(54) MAGNETIC REPRODUCING ELEMENT USING ANOMALOUS HALL EFFECT AND MAGNETIC HEAD USING THE SAME

(75) Inventors: Sarbanoo Das, Kanagawa (JP); Hiroyuki Suzuki, Kanagawa (JP); Masae Suzuki, legal representative, Fujisawa (JP)

(73) Assignee: HGST Netherlands B.V., Amsterdam (NL)

( * ) Notice: Subject to any disclaimer, the term of this patent is extended or adjusted under 35 U.S.C. 154(b) by 426 days.

(21) Appl. No.: 12/556,492

(22) Filed: Sep. 9, 2009

(65) Prior Publication Data

US 2010/0061014 A1   Mar. 11, 2010

(30) Foreign Application Priority Data

Sep. 10, 2008   (JP) ................. 2008-231710

(51) Int. Cl.
*G11B 5/37* (2006.01)

(52) U.S. Cl. ........................ 360/112

(58) Field of Classification Search .......... 360/112
See application file for complete search history.

(56) References Cited

U.S. PATENT DOCUMENTS

| 6,791,792 | B2* | 9/2004 | Takahashi | 360/112 |
| 6,937,434 | B2* | 8/2005 | Takahashi | 360/112 |
| 7,379,321 | B2* | 5/2008 | Ravelosona et al. | 365/145 |
| 2007/0195452 | A1* | 8/2007 | Covington et al. | 360/112 |
| 2008/0144232 | A1* | 6/2008 | Kaka et al. | 360/324.1 |
| 2009/0016098 | A1* | 1/2009 | Wunderlich et al. | 365/158 |
| 2009/0176129 | A1* | 7/2009 | Sarbanoo et al. | 428/811.3 |

FOREIGN PATENT DOCUMENTS

| JP | 04/351708 | 12/1992 |
| JP | 08/231710 | 9/1996 |
| JP | 2000-306376 | 11/2000 |
| JP | 2010067304 A | 3/2010 |

OTHER PUBLICATIONS

English Translation of Oodoi et al. (JP 04-351708 A), published on Dec. 7, 1992.*
N. Nishimura et. al. "Magnetic tunnel junction device with perpendicular magnetization films for high-density magnetic random access memory", Journal of Applied Physics, vol. 91. No. 8, pp. 5246-5249, 2002.
Jian-Gang Zhu et. al, "Spin transfer induced noise in CPP read Heads", IEEE Transactions on Magnetics, vol. 40, No. 1, pp. 182-188, Jan. 2004.
Hiroyuki Katada et. al. "Spin-torque noise in CPP-GMR heads with current screen layer", IEEE Transactions on Magnetics, vol. 42, No. 10, pp. 2450-2452, Oct. 2006.

* cited by examiner

*Primary Examiner* — Will J Klimowicz
(74) *Attorney, Agent, or Firm* — Zilka-Kotab, PC

(57) ABSTRACT

According to one embodiment, magnetic reproducing element for detecting a magnetic field from a magnetic recording medium comprises a sensor film including a perpendicular magnetization film having a magnetization easy axis in a direction perpendicular to a film plane, wherein magnetization in the sensor film tilts upward or downward in an element height direction from the magnetization easy axis while no magnetic field is applied from the magnetic recording medium, and change in anomalous Hall voltage generated in the sensor film is detected, thereby allowing the magnetic field applied from the magnetic recording medium to be detected. Other magnetic reproducing elements and magnetic heads employing magnetic reproducing elements are described as well.

11 Claims, 13 Drawing Sheets

MEDIUM ROTATION DIRECTION

DOWN-TRACK DIRECTION

Fig. 11
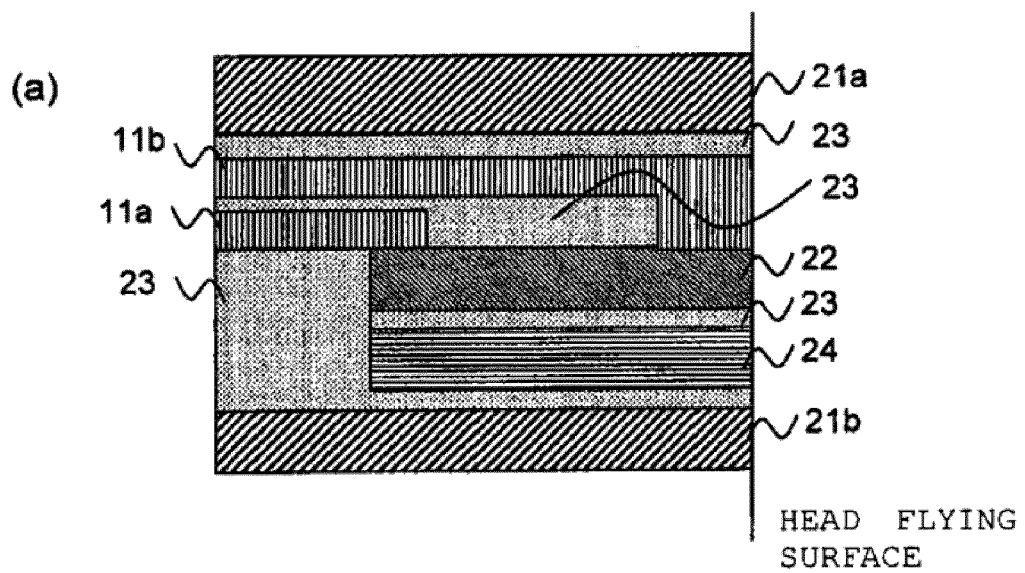
HEAD FLYING SURFACE
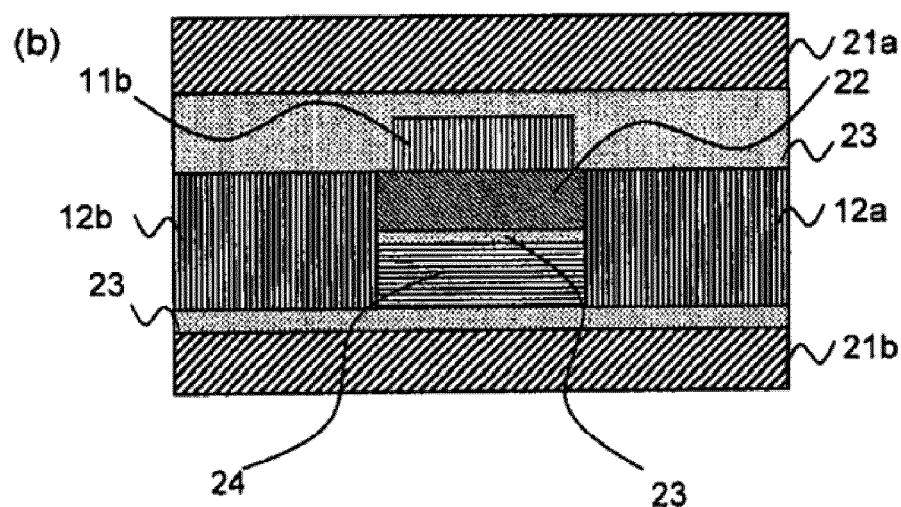

MAGNETIC REPRODUCING ELEMENT USING ANOMALOUS HALL EFFECT AND MAGNETIC HEAD USING THE SAME

RELATED APPLICATIONS

The present application claims the priority of a Japanese Patent Application filed Sep. 10, 2008 under Appl. No. 2008-231710, which is incorporated herein by reference.

FIELD OF THE INVENTION

The present invention relates to a magnetic recording and reading, and specifically relates to a magnetic reproducing element using an anomalous Hall effect, a kind of galvanomagnetic effect, and uses thereof.

BACKGROUND OF THE INVENTION

Demand for various magnetic recording devices, including hard disk drives (HDDs), to have high recording densities is increasing more and more. With the increase in demand for high recording density, a perpendicular magnetic recording method has been actively studied as a method that overcomes the limit of an in-plane magnetic recording method, and HDDs using the perpendicular magnetic recording method have already been commercialized. In order to further increase the recording density of a HDD using the perpendicular magnetic recording method, high track density and higher linear recording density need to be achieved. Among various attempts for increasing the recording density of HDDs in the past, introduction of a reproducing head using a magneto-resistive effect has greatly contributed to improvements. A reproducing head using giant magneto-resistance (GMR) or tunnel magneto-resistance (TMR) is primarily used in such a head. A summary of a current reproducing method using a GMR or a TMR element is described using FIG. 1. The GMR or TMR element has a spin valve structure where a pinning layer 32, in which magnetization is pinned by an antiferromagnetic material, and a free layer 31, in which magnetization may be freely rotated by a magnetic field 37 applied from a medium 30, are provided with an intermediate layer 33 between them. Electric resistance of an element as a whole is changed depending on a relative angle θ formed by magnetization 32a of the pinning layer and magnetization 31a of the free layer. This is a fundamental principle of the spin-valve structure element.

In a current GMR or TMR element, an in-plane magnetization film is used for each of the pinning layer and the free layer. Magnetization of each of the pinning layer and the free layer is stabilized in a plane placed in a direction perpendicular to a down-track direction due to an effect of magnetic anisotropy in an in-plane direction of an element. Magnetization of the pinning layer is stabilized in a cross-track direction due to an effect of a hard bias field applied in the cross-track direction. Electric resistance of the element varies depending on whether magnetization of the free layer is parallel or antiparallel to a magnetization direction of the pinning layer. However, track width 36 is reduced with an increase in TPI (tracks per inch), and therefore in order to prevent information at a track edge or on an adjacent track from being read, reproducing element width 35 is reduced also. However, if an effect of shape magnetic anisotropy in an in-plane direction is strong, and therefore an aspect ratio (element width in the cross-track direction to element height) is reduced, in-plane alignment of magnetization becomes unstable, and a circular magnetization condition is most stable in a film plane. In this condition, sensitivity of a magnetic reproducing element is reduced, and SNR (Signal to Noise Ratio) of a reproducing head is drastically decreased.

As a method of solving the problem of the current memory element (MRAM) using the in-plane magnetization film, N. Nishimura et al. "Magnetic tunnel junction device with perpendicular magnetization films for high-density magnetic random access memory", Journal of Applied Physics, Vol. 91, No. 8, pp. 5246-5249, 2002, describes a method where a perpendicular magnetization film is used so that a TMR effect of an element is used to read data. On the other hand, Jap. Pat. Appl. Nos. JP-A-2000-306376 and JP-A-4-351708 propose data reading using an anomalous Hall effect exhibited by the perpendicular magnetization film. Jap. Pat. Appl. No. JP-A-2000-306376 describes a method where current is flowed only through an upper layer in reading information recorded in two perpendicular magnetization films isolated by an insulating layer, so that anomalous Hall voltage appearing in the upper layer is extracted. Jap. Pat. Appl. No. JP-A-4-351708 describes a method that uses difference in polarity of generated anomalous Hall voltage depending on whether magnetization of a sensor portion is upward or downward when an external magnetic field is applied in a condition that a bias magnetic field is horizontally applied to tilt the magnetization of the sensor portion.

On the other hand, in a current TMR element, quality of an insulating layer used between the pinning layer and the free layer is a significant factor in determining performance of a magnetic reproducing element. How a high-quality insulating film is formed is important, and therefore a formation process of the film is not easy. Alternatively, what is called a CPP (Current Perpendicular to Plane) type GMR head, in which current is flowed in a direction perpendicular to a film plane, could possibly avoid a problem of high TMR element resistance in the CPP-GMR head, when current perpendicularly passes through the pinning layer and the free layer, carrier electrons are magnetically spin-polarized, causing disturbance in relative alignment of internal magnetization between the pinning layer and the free layer. As a result, as described in Jian-Gang Zhu et al. "Spin transfer induced noise in CPP read Heads", IEEE Transactions on Magnetics, Vol. 40, No. 1, pp. 182-188, January, 2004, what is called spin torque noise occurs, causing degradation in SNR of a head. The spin torque noise tends to increase with increase in density of current flowing through an element. The CPP-GMR element structure, which has a merit that element resistance is small compared with the TMR element structure, is considered to be effective for achieving high density. As described in Hiroyuki Katada et al. "Spin-torque noise in CPP-GMR heads with current screen layer", IEEE Transactions on Magnetics, Vol. 42, No. 10, pp. 2450-2452, October, 2006, in the CPP-GMR element structure, an insulating layer having pin holes is provided between the pinning layer and the free layer, so that current density is controlled to improve SNR of the CPP-GMR element.

Therefore, a magnetic reproducing element which has high sensitivity, and thus may reproduce a magnetization pattern recorded on a narrow track, would be beneficial to enable higher track density and higher linear recording density.

SUMMARY OF THE INVENTION

According to one embodiment, magnetic reproducing element for detecting a magnetic field from a magnetic recording medium comprises a sensor film including a perpendicular magnetization film having a magnetization easy axis in a direction perpendicular to a film plane, wherein magnetization in the sensor film tilts upward or downward in an element height direction from the magnetization easy axis while no magnetic field is applied from the magnetic recording medium, and change in anomalous Hall voltage generated in the sensor film is detected, thereby allowing the magnetic field applied from the magnetic recording medium to be detected.

According to another embodiment, a magnetic reproducing element comprises a sensor film including a perpendicular magnetization film, a bias film for applying a bias magnetic field in an in-plane direction of the sensor film, a pair of current terminals for flowing a current through the sensor film, and a pair of voltage terminals for measuring a voltage generated in the sensor film. Change in the perpendicular magnetization component of the sensor film is detected as change in anomalous Hall voltage and is caused by rotation of magnetization in the sensor film due to an external magnetic field applied in the in-plane direction of the sensor film.

In another embodiment, a magnetic head includes a recording element for generating a recording magnetic field to a Magnetic recording medium, and a magnetic reproducing element for detecting a magnetic field from the magnetic recording medium. The magnetic reproducing element includes a sensor film including a perpendicular magnetization film, a bias film for applying a bias magnetic field in an in-plane direction of the sensor film, a pair of current terminals for flowing a current through the sensor film, and a pair of voltage terminals for measuring a voltage generated in the sensor film. Change in a perpendicular magnetization component of the sensor film is detected as change in voltage, the change being caused by rotation of magnetization in the sensor film due to an external magnetic field being applied in the in-plane direction of the sensor film.

Any of these embodiments may be implemented in a magnetic data storage system such as a disk drive system, which may include a magnetic head, a drive mechanism for passing a magnetic medium (e.g., hard disk) over the magnetic head, and a controller electrically coupled to the magnetic head.

Other aspects and advantages of the present invention will become apparent from the following detailed description, which, when taken in conjunction with the drawings, illustrate by way of example the principles of the invention.

BRIEF DESCRIPTION OF THE DRAWINGS

FIG. 11 is diagrams showing wiring to the element (in the case of horizontal bias), according to one embodiment.

DETAILED DESCRIPTION

Figure 1:
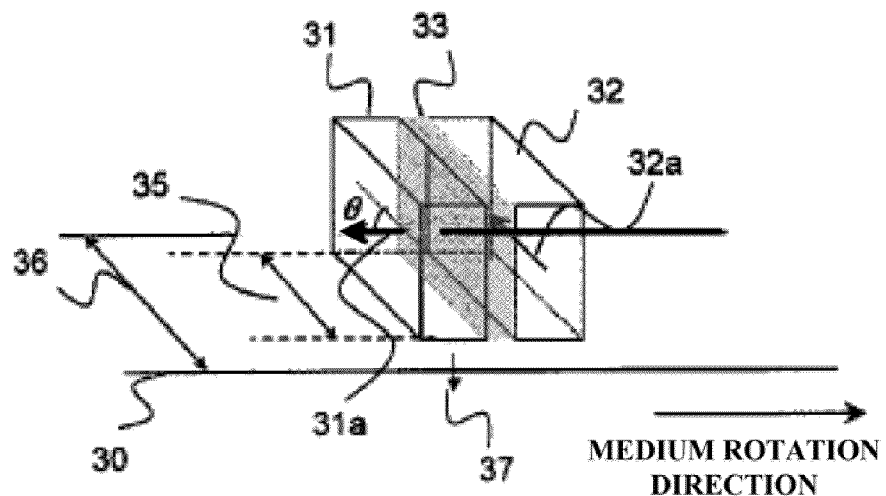
FIG. 1 is an explanatory view of a method of detecting a magnetic field from a medium by a magnetic reproducing element using an in-plane magnetization film, according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of disk-based storage systems and/or related systems and methods, as well as operation and/or component parts thereof.

Track width is essentially reduced for achieving high TPI, and width of a reproducing head using a current GMR or TMR element needs to be decreased in order to read data written in the reduced track. However, if element width in a track-width direction is reduced in, the current head element using an in-plane magnetization film, magnetization has a circular domain structure being stable in energy in an element plane. In this condition, element sensitivity is reduced, and SNR of a reproducing head is accordingly reduced.

Some prior art methods use complete reversal of magnetization, where magnetization reversal irreversibly proceeds. As a result, an anomalous Hall voltage characteristic also draws hysteresis with respect to an external magnetic field. While a reversibly changeable characteristic is desirable for a method of detecting the external magnetic field, the characteristic becomes hysteretic as long as complete reversal of magnetization in a perpendicular magnetization film is used. Therefore, it is difficult to use the sensor using the perpendicular magnetization film for a device such as HDD, which needs to determine "1" or "0" of data at high speed.

In the case of an element structure having a pseudo-insulating layer having pin holes, spin torque noise differently occurs depending on the number of the pin holes, or a shape or position of each pin hole, which affects SNR of an element. Therefore, process optimization enables forming such an element structure, and therefore the element structure cannot be easily formed. Furthermore, in a CPP-GMR element structure having the pseudo-insulating layer, element resistance is determined by a characteristic of the insulating layer essentially similarly as in the TMR element structure. In achieving high SNR of a head for high density, reduction in element resistance is important even in the CPP-GMR structure having the pseudo-insulating layer as in the TMR structure. In such a CPP-GMR structure, the insulating layer is finally eliminated so that what is called an all-metal type is formed, thereby element resistance can be remarkably reduced. However, spin torque noise significantly increases, in addition, heat generation occurs.

To address these problems, a differential-type head element has been proposed for the CPP-GMR head, in which two free layers are provided, and a difference in output between them is used. However, it is considered that increase in spin torque noise commonly occurs even in such a structure.

Moreover, all the described reproducing head elements have the spin valve structure as a basic structure, and therefore many layers including an underlayer, a pinning layer, an intermediate layer (or insulating layer), and a free layer are typically necessary to be deposited. Particularly, in the differential-type head structure, after one spin valve structure is formed, another free layer (or spin valve structure as a whole) needs to be formed. As a result, since thickness of an element is increased in a down-track direction, resolution is reduced in high linear recording density.

In this way, the current reproducing head element structure has many problems in achieving further high recording density of HDD. Thus, an object of the invention is to provide a reproducing head, which has high sensitivity, and thus may meet narrow track width to achieve high recording density invention, that uses an anomalous Hall effect of a perpendicular magnetization film having magnetic anisotropy in a direction perpendicular to a film plane. While magnetization in a sensor film including a perpendicular magnetization film is tilted upward or downward in an element height direction from a magnetization easy axis in a condition that no external magnetic field is applied, an external magnetic field is detected by detecting change in anomalous Hall voltage generated in the sensor film. To tilt the magnetization in the sensor film upward or downward in the element height direction from the magnetization easy axis in the condition that no external magnetic field is applied, a bias film is used which applies a bias magnetic field in an in-plane direction of the sensor film. Change in the perpendicular magnetization component, which is caused by rotation of magnetization in the sensor film in an applied magnetic-field direction, is detected as change in voltage caused by the anomalous Hall effect. The bias film is an in-plane magnetization film adjacent to or stacked on the sensor film, and an insulating film is disposed between the bias film and the sensor film. The sensor film has current flowing in a direction parallel to a medium-facing surface so that voltage generated in a direction perpendicular to the medium-facing surface is detected.

The invention may solve the problems that are confronted by the current magnetic reproducing element using an in-plane magnetization film in meeting narrow track width. A magnetization easy axis direction of a sensor film that detects an external magnetic field is along a down-track direction, and therefore even if element width in a cross-track direction is decreased, the magnetization easy direction is not affected, and consequently perpendicular alignment of magnetization is kept.

The invention uses anomalous Hall voltage exhibited by a perpendicular magnetization film in a method of detecting an external magnetic field, which is not based on complete reversal of magnetization, but is based on a phenomenon that element magnetization rotates due to an effect of an external magnetic field, so that a perpendicular magnetization component thereof is changed. Therefore, a sensitivity characteristic with respect to an external magnetic field is reversible, which is suitable for a sensor.

Furthermore, completely unlike a spin valve structure being a basic structure of the previous GMR or TMR element, in the magnetic reproducing element of the invention, only a layer corresponding to a free layer of GMR or TMR is used as a basic configuration, thereby number of layers required for the previous GMR or TMR element can be remarkably decreased, which is a large merit even in the light of production.

In CPP-GMR or TMR, spin torque noise occurs due to a phenomenon that current flows in a direction perpendicular to a film plane. In the case of the all-metal CPP-GMR head being regarded to be effective for reducing element resistance, the spin torque noise further increases, which is considered to be extremely problematic. In contrast, in the magnetic reproducing element of the invention, since current is flowed in an in-plane direction of a film, the spill torque noise does not occur.

Hereinafter, a preferred embodiment of the invention will be described with reference to drawings. A magnetic reproducing element of the invention has a perpendicular magnetization film, and uses change in anomalous Hall voltage generated from the perpendicular magnetization film in a method of detecting a leakage magnetic field from a medium. The anomalous Hall voltage is caused by an "anomalous Hall effect" exhibited by the perpendicular magnetization film. When current is flowed through a magnetic film having spontaneous magnetization, carriers are scattered in a direction perpendicular to a forward direction in a film plane due to spin-orbit interaction acting between the moving carriers and the spontaneous magnetization:The scattering phenomenon dependent on spontaneous magnetization in a film, namely, dependent on spin is known as the anomalous Hall effect. Carrier density distribution is formed on both sides in a direction perpendicular to a current flow direction in a film plane, so that electromotive force is newly generated. The electromotive force can be extracted as the anomalous Hall voltage. The anomalous Hall voltage is expressed as Equation (1).

$$V_H = R_{AHE} \frac{I(M)_\perp}{t} \qquad \text{Equation (1)}$$

In Equation (1), $V_H$ shows anomalous Hall voltage, $R_{AHE}$ shows an anomalous Hall coefficient, l shows current flowed through a film, $(M)_\perp$ shows a component in a normal direction to a film of in-film spontaneous magnetization (hereinafter, called "perpendicular magnetization component"), and t shows thickness of a film. As known from Equation (1), the anomalous Hall voltage is in proportion to current flowed through a film, that is, when electric resistance of a film is determined, the anomalous Hall voltage is in proportion to voltage applied between two points in the film. Furthermore, since the anomalous Hall voltage is in proportion to spontaneous magnetization in a film, as spontaneous magnetization is larger, larger anomalous Hall voltage is generated. Furthermore, the anomalous Hall voltage is inversely proportional to thickness, that is, as film thickness is reduced, sensitivity is improved. The anomalous Hall coefficient in Equation (1) is an important factor in characterizing the anomalous Hall effect, and is dependent on a physical structure of an objective film (for example, types of compositional elements, a composition ratio, uniformity, etc.), and an electronic structure (for example, a shape of a Fermi surface, a carrier type:

electron or hole, etc.). Generally, large anomalous Hall voltage is generated when the anomalous Hall coefficient is large.

Figure 2:
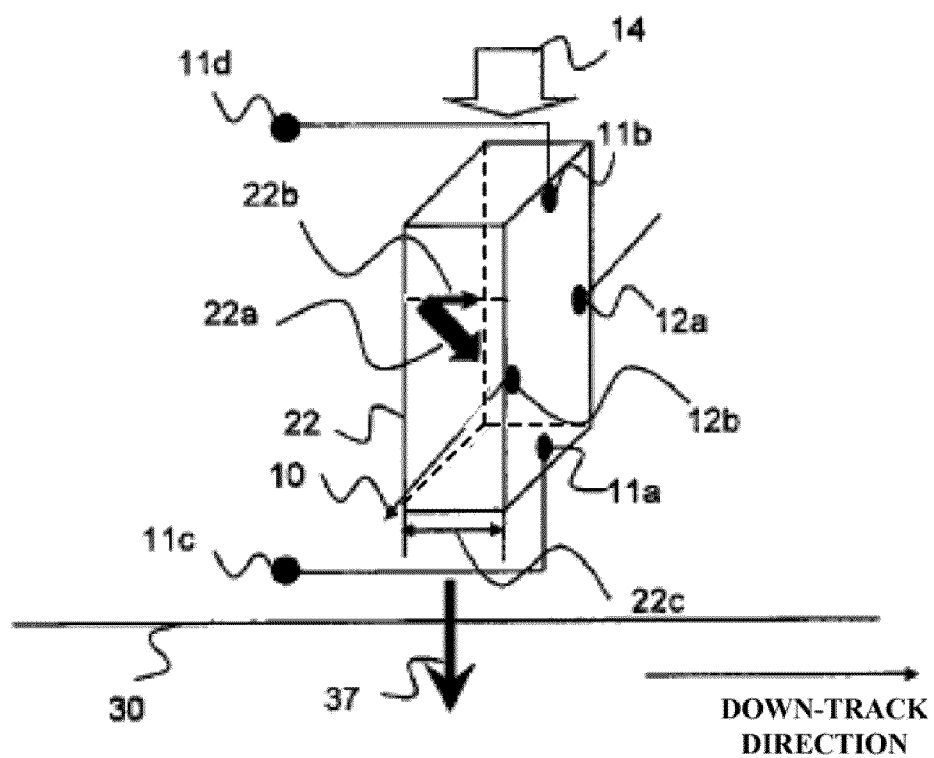
FIG. 2 is a view showing a basic structure of a magnetic reproducing element, according to one embodiment.

FIG. 2 shows a structure of a magnetic reproducing element according to one embodiment. An element film 22 acting as a sensor (hereinafter, called sensor film) is a perpendicular magnetization film, and a magnetization easy axis of the film is parallel to a track direction (down-track direction) of a medium 30. Current 10 is flowed through the sensor film 22 via a pair of current electrodes 12a and 12b. Anomalous Hall voltage $V_H$ is extracted between voltage electrode terminals 11c and 11d via a pair of voltage electrodes 11b and 11a. The sensor film 22 is applied with a bias magnetic field 14 from a side opposite to a medium 30 side. The bias magnetic field 14 is applied in such a manner that spontaneous magnetization 22a in the sensor film 22 is tilted upward or downward in an element height direction from the magnetization easy axis of the film 22. In the figure, the bias magnetic field is applied such that the spontaneous magnetization 22a is tilted downward in the element height direction, that is, tilted toward the medium. However, the bias magnetic field may be conversely applied so that the spontaneous magnetization is tilted upward in the element height direction, that is, tilted to the upside of the figure.

Figure 3:
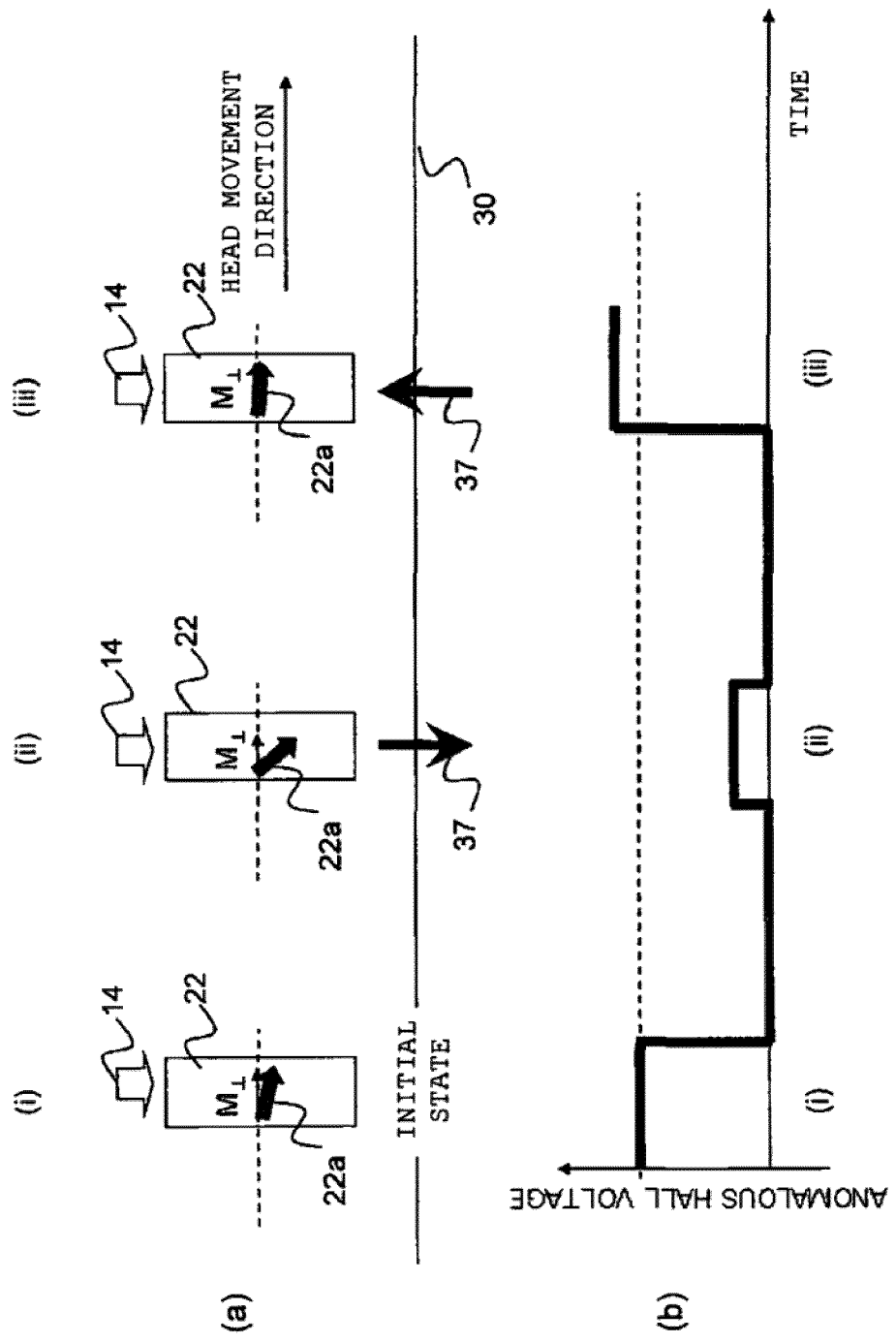
FIG. 3 is views showing operation of the magnetic reproducing element, according to one embodiment.

An operation principle of the magnetic reproducing element, according to one approach, is described using FIG. 3. FIG. 3(a) shows a physical state of an element in operation. In an initial state, that is, in a condition (i) where the element is not subjected to a magnetic field from the medium 30, the spontaneous magnetization 22a in the sensor film 22 is stabilized with an angle being kept from the magnetization easy axis of the film 22 due to an effect of the bias magnetic field 14. When a downward magnetic field 37 is applied from the medium 30 as shown in (ii), the spontaneous magnetization 22a in the sensor film 22 rotates in a direction further away from the initial state due to the magnetic field from the medium. When an upward magnetic field 37 is applied from the medium 30 as shown in (iii), the spontaneous magnetization 22a in the sensor film 22 rotates in an opposite direction, that is, rotates upward so as to return in a direction to a magnetization easy axis. Since the bias magnetic field 14 exists, when a downward magnetic field and an upward magnetic field, each having the same magnitude, are separately applied to the sensor film 22, rotation amount of the spontaneous magnetization 22a in the sensor film 22 in a direction away from the magnetization easy axis is different from rotation amount thereof in a direction returning to the magnetization easy axis. As shown in the figure, since the bias magnetic field 14 is applied in the same direction as the downward magnetization from the medium 30, the rotation amount in the direction away from the magnetization easy axis (that is, downward direction) is large compared with the rotation amount in the opposite direction, that is, rotation amount in the case that upward magnetization is applied from the medium 30. When a rotation angle from the magnetization easy axis of the spontaneous magnetization 22a in the sensor film 22 varies, magnitude of a perpendicular magnetization component 22b is accordingly changed, and consequently the anomalous Hall voltage detected between the voltage electrode terminals 11e and 11d is changed.

FIG. 3(b) shows change in anomalous Hall voltage. As shown in (ii), where downward magnetization is applied from the medium 30, the rotation angle of the spontaneous magnetization 22a in the sensor film 22 is increased, and the perpendicular magnetization component 22b of the film is reduced, and consequently the anomalous Hall voltage is reduced. On the other hand, as shown in (iii), where an upward magnetic field is applied from the medium 30, the rotation angle of the spontaneous magnetization 22a in the sensor film 22 is reduced, and the perpendicular magnetization component 22b is increased, and consequently the anomalous Hall voltage is increased. A magnitude correlation of anomalous Hall voltage detected for a certain base line is determined, whereby detection can be made on whether an "upward" or "downward" magnetic field is applied from the medium.

Figure 4:
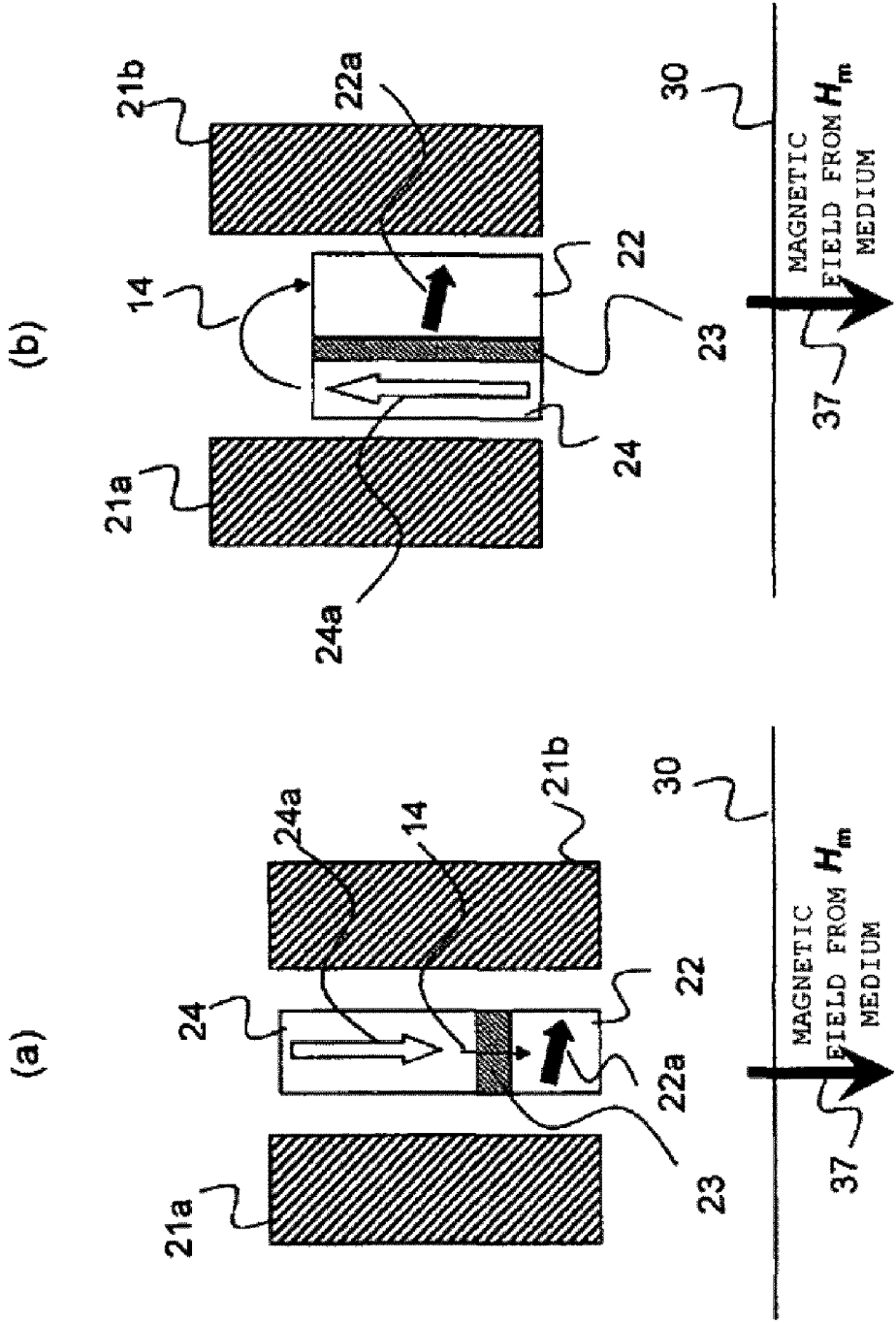
FIG. 4 is explanatory views of a method of applying bias to the magnetic reproducing element, according to one embodiment.

Next, how to apply the bias magnetic field to the sensor film is described, according to one approach. The bias magnetic field is applied to the sensor film from a side opposite to a medium-facing surface of the sensor film. Even if a bias magnetic field is applied from the side of the medium-facing surface of the sensor film 22, an initial state of the sensor film can be established. However, the bias magnetic field possibly affects a leakage magnetic field from the medium at the time of reproduction, so that sensing sensibility may be reduced, therefore the bias magnetic field is desirably applied from the side opposite to the medium-facing surface. FIG. 4 shows formation of the bias layer by two different methods. Other methods are possible also. A structure shown in FIG. 4(a) may be formed by a method called vertical bias method, and a structure shown in FIG. 4(b) may be formed by a method called horizontal bias method. In the figure, 21a and 21b show side shields respectively. In the vertical bias method, a bias layer 24 having magnetization 24a exists on the sensor film 22 in a view from a flying surface side. In the horizontal bias method, the bias layer 24 and the sensor film 22 are in a stacked form in a down-track direction.

An insulating layer 23 is provided between the sensor film 22 and the bias layer, according to some approaches. The insulating layer 23 limits current so that the current flows only through the sensor film 22, thereby Hall voltage is prevented from being generated from the bias layer 24 due to current flow through the bias layer 24. A material having high electric resistance is desirable for the insulating layer 23, and for example, an oxide film of Al or Si may be used. The insulating layer 23 mainly acts to prevent current from flowing through the bias layer 24, and may have predetermined insulating performance by optimizing a thickness and compositional materials thereof. The insulating layer may or may not include a film having high crystallinity for improving a magneto-resistive effect unlike a TMR element film. Thickness of the insulating layer affects not only insulating performance, but also guides the bias magnetic field 14 from the bias layer 24 to the sensor film 22. If thickness of the insulating layer 23 is increased, a distance between the bias layer 24 and the sensor film 22 is increased, which may weaken a bias magnetic field. Thickness of the insulating layer 23 may be adjusted, thereby resulting in certain guiding efficiency of the bias magnetic field to the sensor film and certain insulating performance being achieved together.

Magnetization in the sensor film 22 may be tilted by a predetermined angle from an easy axis of the film in a direction to a medium or a direction opposite to the direction in an initial state of magnetizing the sensor film, according to preferred approaches. Such tilting conditions are determined by the magnetic field 14 applied from the bias layer 24 and response of the magnetization 22a in the sensor film to the magnetic field. A film having in-plane magnetic anisotropy is used for the bias layer 24. As the in-plane magnetization film, a Fe—Co alloy film, a Co—Cr alloy film with a Cr alloy underlayer, a Co—Pt alloy film, etc., and combinations thereof may be used. A uniform magnetic field is desirably generated from the bias layer to the sensor film, and therefore formation of magnetic domains is suppressed within the bias layer.

A perpendicular magnetization film is included for a material of the sensor film 22, and magnetization in the film can easily rotate in a direction away from or approaching an easy axis, according to some embodiments. This can be achieved by using a film having an excellent, perpendicular soft-magnetic characteristic. Rotation of magnetization in the sensor film induces change in a perpendicular magnetization component of the film, and as this change becomes larger, change in outputted anomalous Hall voltage becomes larger. A material having a large anomalous Hall coefficient is desirably used for the sensor film in order to achieve a large anomalous Hall voltage. As a thin film material that enables easy rotation of magnetization in a perpendicular magnetization film, a rare-earth/transition metal film, for example, a FeCo film containing Gd may be used. The rare-earth/transition metal material becomes a perpendicular magnetization film near a compensation point, and accordingly the anomalous Hall coefficient becomes large, and consequently a large anomalous Hall voltage is generated. A switching magnetic field of the rare-earth/transition metal film also becomes large near the compensation point. However, a composition near the compensation point and a film formation condition are optimized, thereby the switching magnetic field can be reduced while keeping the large anomalous Hall coefficient. Alternatively, an artificial-lattice multilayer film structure may be used as a material having a large anomalous Hall coefficient. For example, a multilayer film structure with X/Y (X=Fe or Co; Y=Pt or Pd) as a unit period may easily have perpendicular magnetic anisotropy by changing thickness of each of X and Y or an interface state between X and Y in each period. Moreover, a configuration of the multilayer film (for example, number of periods or thickness of each layer), or a condition during film formation (for example, in the case of film formation by sputter, gas pressure, or a gas species) is adjusted, thereby a film having a low switching magnetic field can be formed.

Figure 5:
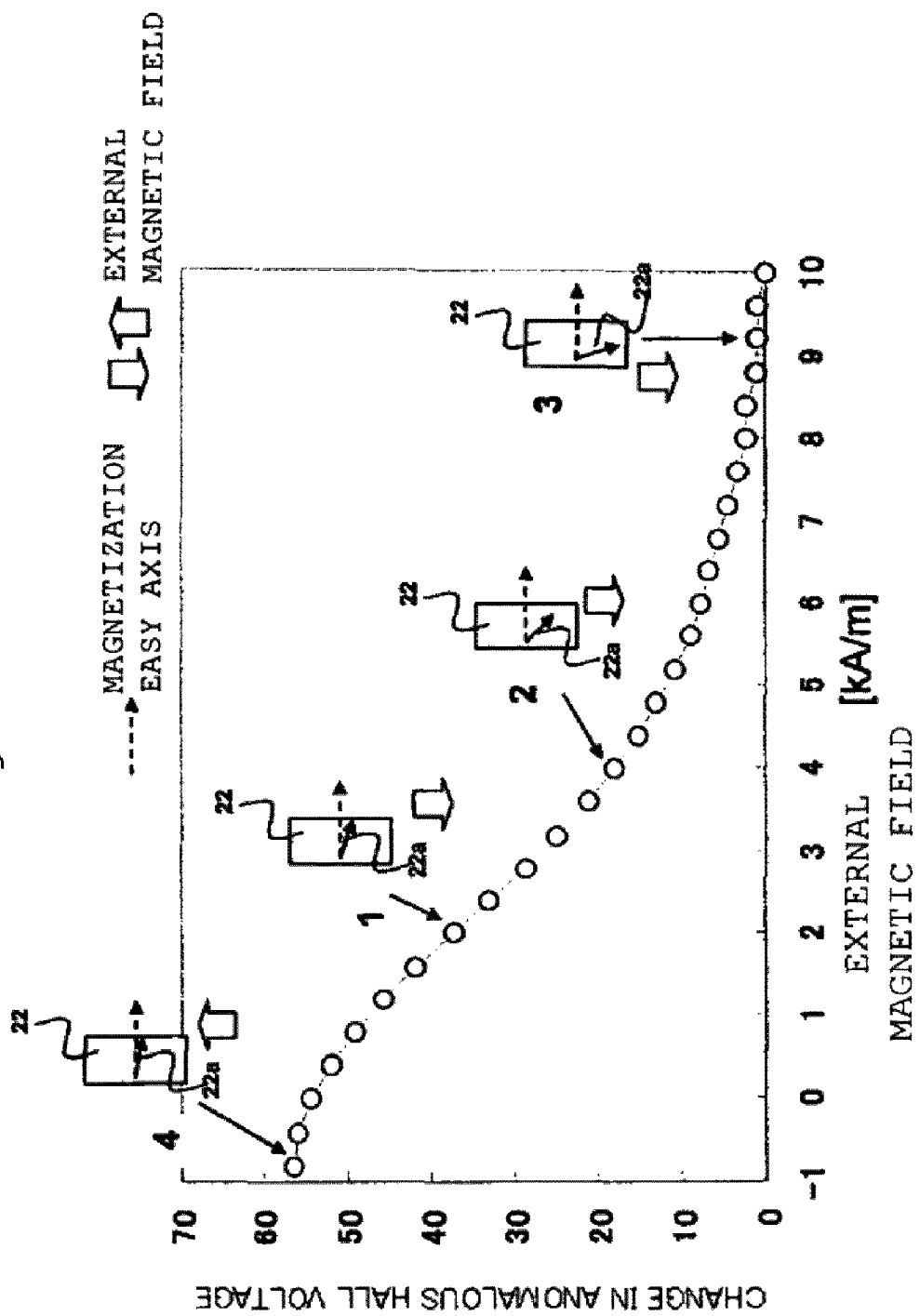
FIG. 5 is a diagram for illustrating switching of a sensor film.

Next, a relationship between a magnetic field 14 ($H_b$) from the bias layer, a magnetic field 37 ($H_m$) from the medium, and a switching magnetic field $H_{sw}$ of the sensor film is described with reference to FIG. 5. A horizontal axis of FIG. 5 shows magnitude of an external magnetic field applied in a direction perpendicular to a magnetization easy axis of the sensor film, that is, in an in-plane direction of the film. A positive magnetic field shows a magnetic field in the case that the magnetic field is applied in a direction where magnetization 22a is away from the magnetization easy axis of the sensor film 22 (an external magnetic field shown by a downward, thick arrow in the figure), and a negative magnetic field shows a magnetic field in the case that the magnetic field is applied in a direction where the magnetization 22a rotates in a direction to the magnetization easy axis of the sensor film 22 (an external magnetic field shown by an upward, thick arrow in the figure). A vertical axis of FIG. 5 shows change in anomalous Hall voltage along with rotation of the magnetization 22a in the sensor film 22 when the magnetization rotates due to an effect of the external magnetic field. When the external magnetic field is increased to a certain degree or more, the magnetization 22a does not further rotate, and the anomalous Hall voltage is accordingly hardly changed. The vertical axis of FIG. 5 shows change in anomalous Hall voltage in a region where the voltage is significantly reduced from its maximum value.

When an external magnetic field is gradually increased from a condition that no external magnetic field is applied, an aspect of rotation of the magnetization 22a in the sensor film 22 is shown in order of states 1, 2 and 3 in FIG. 5. As the external magnetic field is increased, the magnetization 22a in the sensor film 22 rotates in a direction away from a magnetization easy direction, and a perpendicular magnetization component of the film is decreased, therefore an anomalous Hall voltage is decreased in order of the states 1, 2 and 3. When the external magnetic field is sufficiently large, the magnetization 22a in the sensor film falls down in a plane of the sensor film 22, so that the perpendicular magnetization component of the film disappears, and therefore the anomalous Hall voltage becomes zero. A magnetic field at which the anomalous Hall voltage becomes zero is assumed as the switching magnetic field $H_{sw}$ of magnetization in the sensor film. A particular relationship exists between the bias magnetic field $H_b$, and the external magnetic field or the magnetic field $H_m$ applied from the medium. Here, it is assumed that an upward magnetic field from the medium is a negative field, and a downward magnetic field is a positive field. In an initial state, that is, in the condition that no magnetic field is applied from the medium, $H_b < H_{sw}$ is given. When the downward magnetic field $H_m$ is applied from the medium to the sensor film, magnetization in the sensor film is most distant from a magnetization easy axis thereof in a condition that $H_m + H_b > H_{sw}$ is established, and the anomalous Hall voltage becomes lowest with respect to the initial state. On the other hand, when the upward magnetic field $-H_m$ is applied from the medium to the sensor film, a magnetic field of $|H_b - H_m|$ in total is applied to the sensor film. Since $|H_b - H_m| > H_b$ is given in this condition, the magnetization 22a in the sensor film rotates in a direction to the magnetization easy axis with respect to the initial state. Therefore, the perpendicular magnetization component 22b increases (state 4 in FIG. 5), and the anomalous Hall voltage becomes high compared with an initial voltage level as shown in the state (iii) of FIG. 3. The bias-layer magnetic field $H_b$ is determined by a material used for the bias layer, a distance from the sensor film isolated by an insulating layer, and the like. On the other hand, the switching magnetic field $H_{sw}$ and the anomalous Hall voltage from the sensor film are determined by material of the sensor film, a soft magnetic property thereof, a degree of change in perpendicular magnetization component, and the like.

Next, description is made of parameters of the sensor film that affect change in anomalous Hall voltage due to the switching magnetic field of the sensor film, and rotation of magnetization in the sensor film, according to one example. A sensor film prepared in the example and a characteristic of an element using the sensor film are described as an example. A $Gd_x (Fe_y Co_{100-y})_{100-x}$ (x is 20 to 30 at. %, and y is 80 to 90 at. %) thin film was prepared as the sensor film on a nonconductive substrate by an ion beam sputter method. An element pattern was formed in the prepared thin film by lithography. While element height was fixed to 50 nm, element width (width in a track width direction) was varied in a range of 20 to 60 nm. An in-plane magnetization film including Co-25 at. % Pt was used for the bias layer. The film was deposited by DC magnetron sputter using a Co—Pt alloy target. An alloy film including Co—Pt—Cr may be used for the bias layer. Each of the alloys typically has a crystal structure including a mixed phase of a face-centered cubic structure and a hexagonal close-packed structure. Alumina or a silicon oxide was used for the insulating layer 23 between the bias layer 24 and the sensor film 22. A soft magnetic material such as NiFe was used for each shield film. The electrodes 12a and 12b for flowing a current through the sensor film 22, and the electrodes 11a and 11b for extracting the anomalous Hall voltage were formed of a conductive material such as Cr or Cu.

In the case of the horizontal bias type, a lower shield 21b is formed on a nonconductive substrate, then a bias layer 24 is formed thereon while being insulated by an insulating layer, and then an insulating layer 23 is further formed thereon. A sensor film 22 is formed on the insulating layer 23, and voltage electrodes 11a and 11b are formed thereon. Current electrode films 12a and 12b are formed on both sides of the sensor film 22 by using photolithography. After the voltage electrodes and the current electrodes are formed, the electrodes are covered by an insulating layer 23, and an upper shield 21a is formed thereon.

In the case of the vertical bias type, a lower shield 21b is formed on a nonconductive substrate, and then an insulating layer is formed thereon. A sensor film 22 and a bias layer 24 are formed on the insulating layer while being isolated by an insulating layer 23. Then, voltage electrodes and current electrodes are formed thereon in the same way as in the horizontal bias type, and then an insulating layer is formed thereon. Finally, an upper shield film 21a is formed on the insulating layer.

Figure 6:
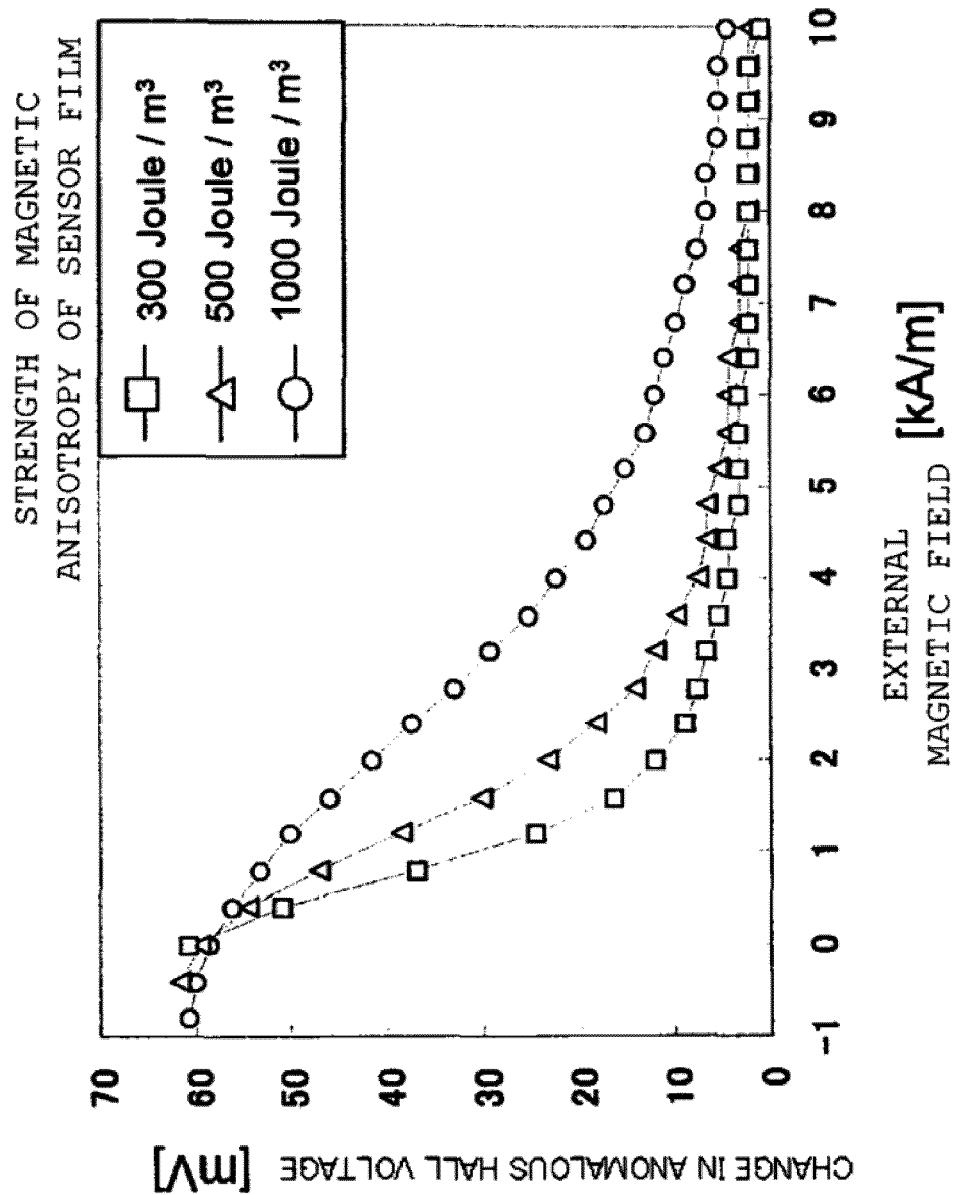
FIG. 6 is a diagram showing a relationship between strength of magnetic anisotropy of the sensor film and change in anomalous Hall voltage.
Figure 7:
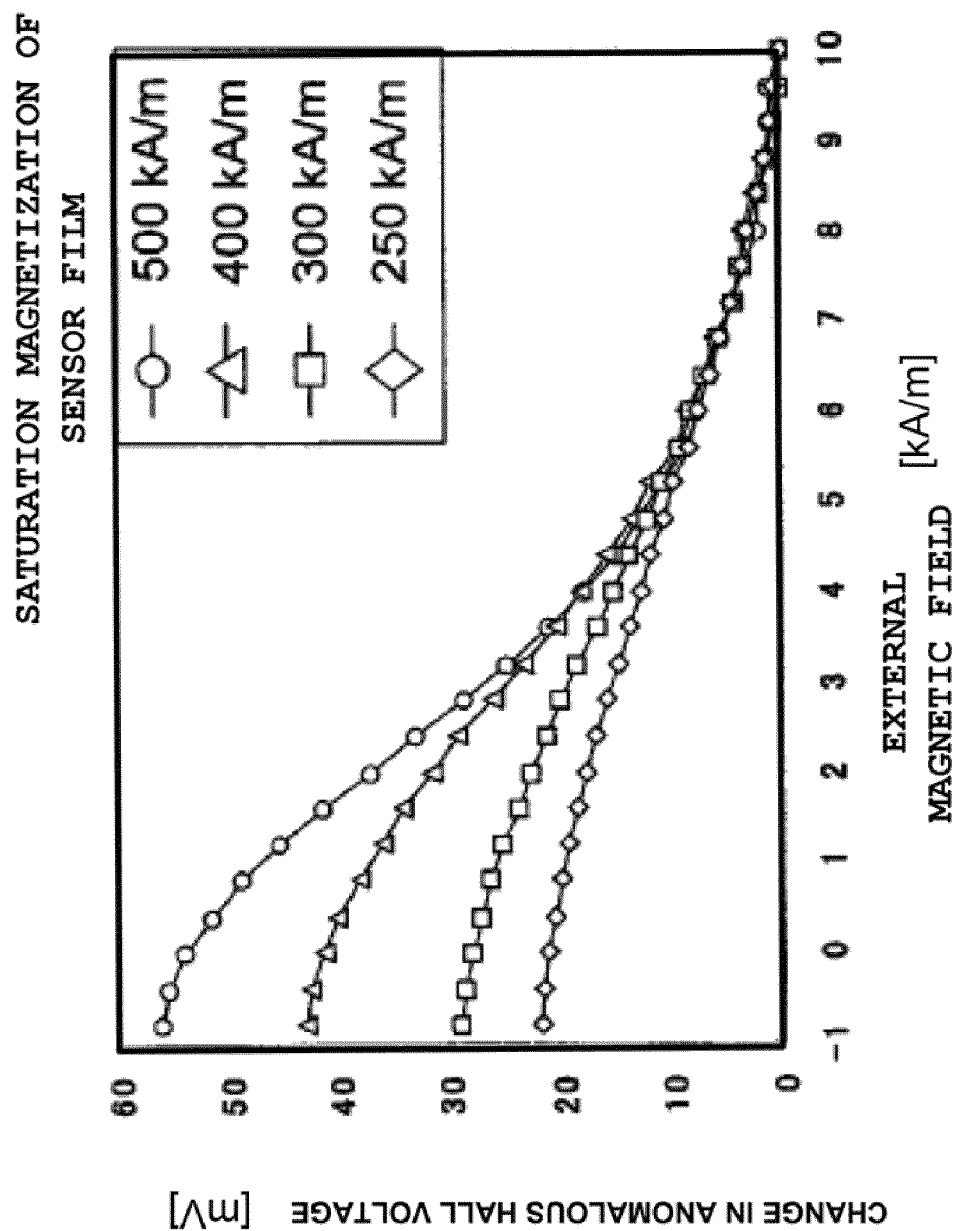
FIG. 7 is a diagram showing a relationship between saturation magnetization of the sensor film and change in anomalous Hall voltage.
Figure 8:
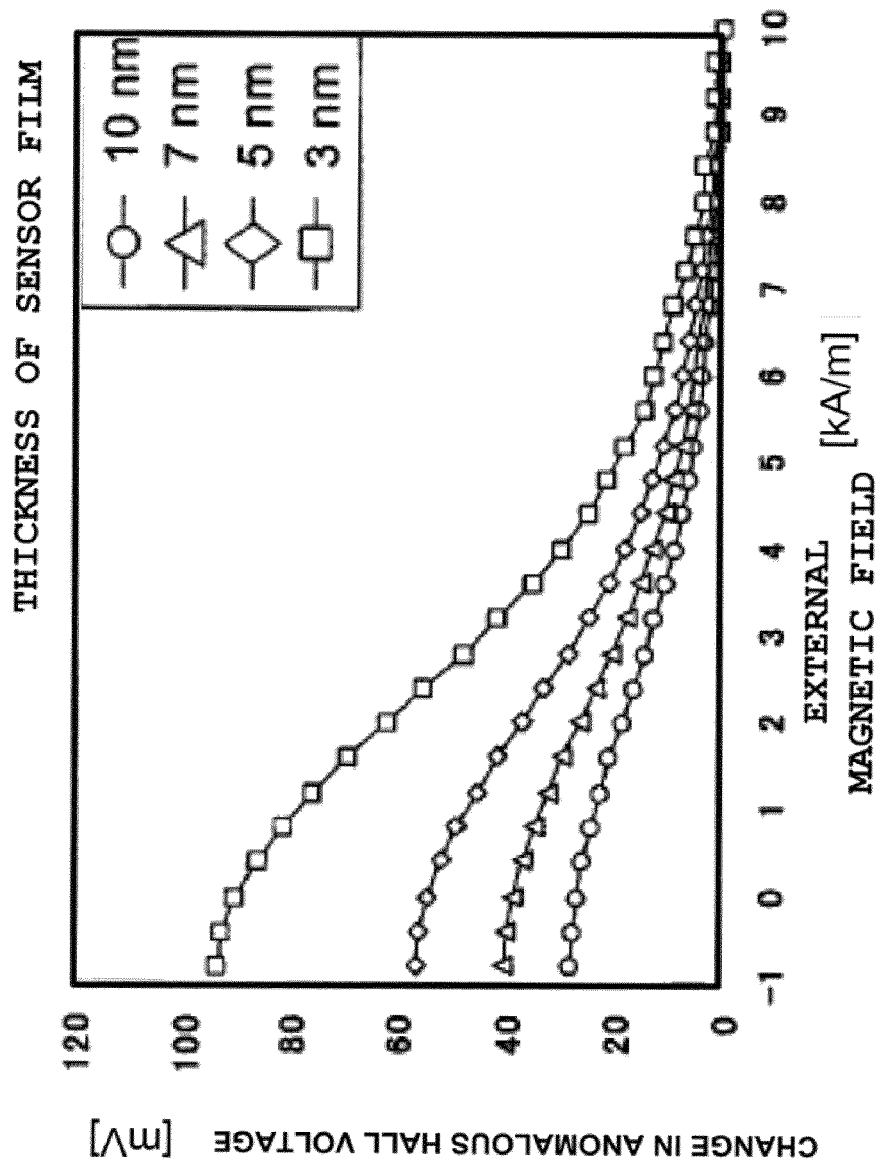
FIG. 8 is a diagram showing sensor-thickness dependence of change in anomalous Hall voltage.

As one large factor in determining sensitivity of the magnetic reproducing element according to the invention, change in anomalous Hall voltage due to rotation of magnetization in the sensor film is given. When such change is large, reproducing sensitivity is also large. Change in anomalous Hall voltage is dependent on rotatability of magnetization in the sensor film. The rotatability of magnetization in the sensor film is affected by perpendicular magnetic anisotropy energy, saturation magnetization, and thickness of the sensor film. A switching magnetic field of the sensor film is desirably reduced to the utmost in order to easily rotate magnetization in the sensor film. FIGS. 6, 7 and 8 show change in anomalous Hall voltage with respect to an external magnetic field in the case that physical parameters of a sensor film having an element width of 58 nm are changed. In the figures, a horizontal axis shows strength of an external magnetic field applied in an in-plane direction of the sensor film. A positive, externally-applied magnetic field shows that the magnetic field is applied in a direction where magnetization in the sensor film rotates in a direction away from an easy axis direction with respect to an initial state of the magnetization, and a negative magnetic field shows that the magnetic field is applied in a direction where the magnetization 22a rotates in a direction to a magnetization easy axis direction. A point at which the external magnetic field is "0" corresponds to the initial state. A vertical axis of each of FIGS. 6, 7 and 8 shows change in anomalous Hall voltage.

FIG. 6 shows the influence of perpendicular magnetic anisotropy of the sensor film on change in anomalous Hall voltage. When perpendicular magnetic anisotropic energy per unit volume of the sensor film is changed, absolute amount of change in anomalous Hall voltage does not change, but the switching magnetic field is greatly affected. When the perpendicular magnetic anisotropic energy per unit volume is reduced, the switching magnetic field of the sensor film is decreased. Decreased switching magnetic field improves sensitivity to a low leakage magnetic field from a medium in a region of higher line recording density, consequently improvement in resolution can be expected.

FIG. 7 shows influence of saturation magnetization of the sensor film on change in anomalous Hall voltage. When saturation magnetization of the sensor film is increased, anomalous Hall voltage in the initial state is increased, and amount of change in anomalous Hall voltage is accordingly increased. The phenomenon is caused by a fact that anomalous Hall voltage is proportional to saturation magnetization of a film generating the voltage as shown in Equation (1). This contributes to increasing reproduced output.

FIG. 8 shows influence of thickness of the sensor film on change in anomalous Hall voltage. When thickness of the sensor film is decreased, anomalous Hall voltage in the initial state is increased, and voltage to be changed with respect to the external magnetic field is accordingly increased. This is because the anomalous Hall voltage increases in inverse proportion to thickness as shown in Equation (1). Moreover, as seen from the figure, the switching magnetic field tends to be slightly reduced with decrease in thickness of the sensor film.

Figure 9:
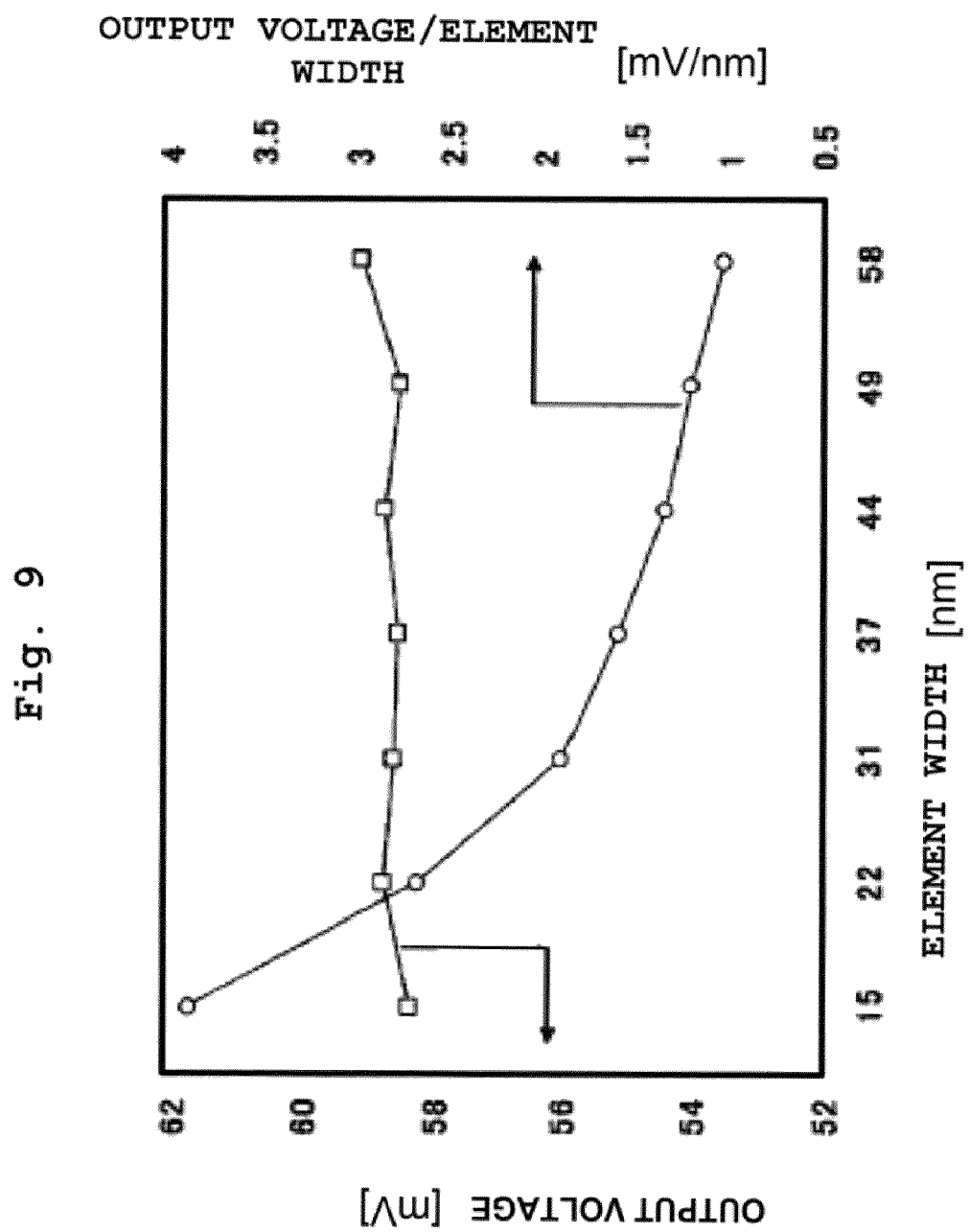
FIG. 9 is a diagram showing change in element output with respect to element width.

FIG. 9 shows output voltage with respect to element width in a track width direction (left vertical axis), and output per unit width (right vertical axis). Here, it is assumed that sensor thickness is 5 nm, and constant current flows in an element width direction. When element width was varied in a range of 15 to 58 nm, change in output was scarcely seen, and output per unit width was increased. This shows that even if element width is reduced, the sensor film being a perpendicular magnetization film is hardly affected, and shows that an element can meet narrow track width. For example, a magnetic reproducing element, which can meet a narrow track of about 20 nm, is used, thereby a track density of 1000 ktpi (kilo tracks per inch) or more can be attained. Furthermore, since sensor thickness of about 5 nm allows an element to meet bit length in a down-track direction, line recording density of about 5000 kbpi (kilo bits per inch) can be achieved.

Figure 10:
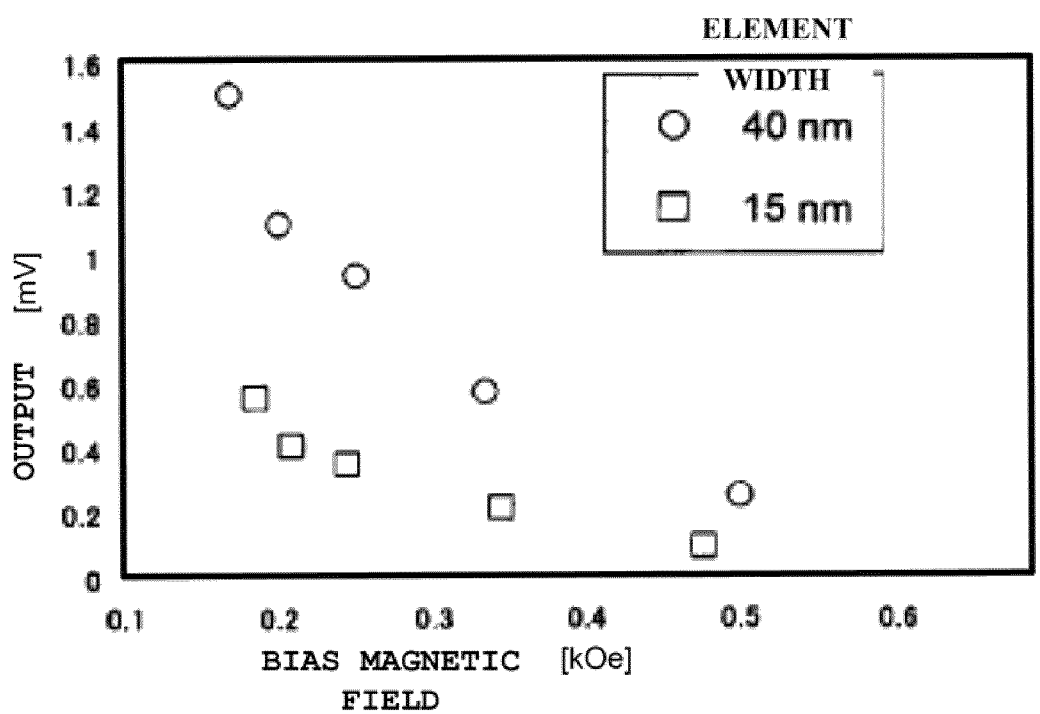
FIG. 10 is a diagram showing a relationship between a bias magnetic field applied to an element of a reproducing head using an in-plane magnetization film and reproduced output for each of different element width dimensions.

On the other hand, the current GMR head having a spin valve structure using an in-plane magnetization film needs to be modified in some way, for example, it needs to be strengthened in bias magnetic field, to prevent formation of a circular domain structure in a region of element width of 20 nm or less. However, if the bias magnetic field is strengthened, rotation of magnetization in a free layer becomes dull, leading to reduction in reproduced output. FIG. 10 shows change in reproduced output with respect to a bias magnetic field in a current GMR element. Reduction in reproduced output along with increase in bias magnetic field is more significantly seen in the region of element width of 20 nm or less.

Figure 12:
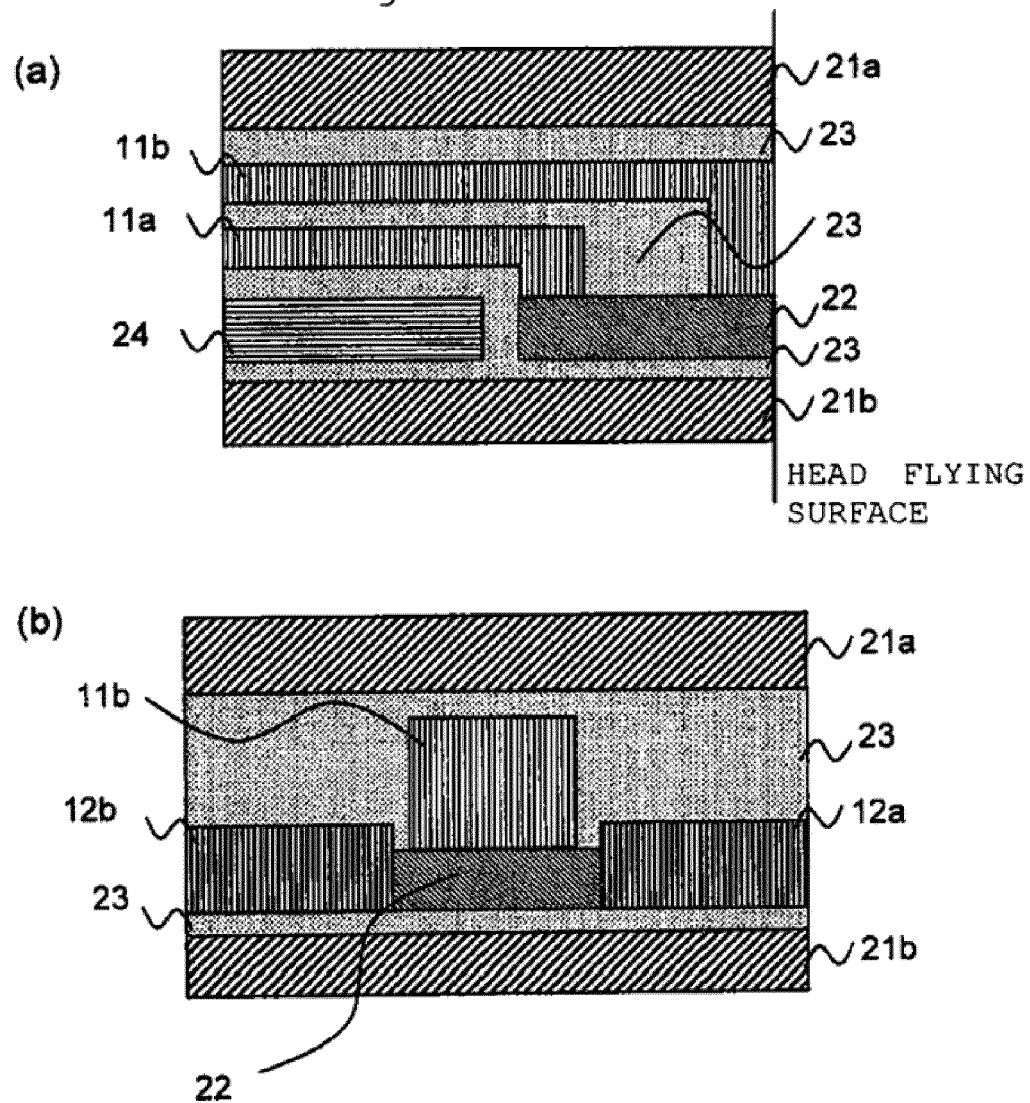
FIG. 12 is diagrams showing wiring to the element (in the case of vertical bias), according to one embodiment.

Next, a layout of the electrodes for flowing a current through the sensor film, and a layout of the electrodes for detecting the anomalous Hall voltage are described. FIG. 11 shows the layouts of the horizontal-bias-type element, and FIG. 12 shows the layouts of the vertical-bias-type element. In each figure, (a) shows a schematic section view of the element, and (b) shows a schematic view seen from a head flying surface.

As shown in FIG. 11, in the case of the horizontal bias type, an insulating layer 23 is formed on a lower shield film 21b, and a bias layer 24, an insulating layer 23, and a sensor film 22 are sequentially deposited on the insulating layer. Voltage electrode films 11a and 11b are formed on the sensor film, and current electrodes 12a and 12b are formed in a direction perpendicular to the voltage electrode films. After the electrodes are formed, an insulating layer 23 is formed in a manner of covering the respective electrodes, and an upper shield film 21a is formed thereon.

As shown in FIG. 12, in the case of the vertical bias type, an insulating layer 23 is formed on a lower shield 21b, and a sensor film 22 and a bias layer 24 are formed while being isolated by an insulating layer. Voltage electrode films 11a and 11b are formed thereon, and current electrodes 12a and 12b are formed in a direction perpendicular to the voltage electrode films. After the electrodes are formed, an insulating layer 23 is formed, and an upper shield film 21a is formed thereon.

In any of the structures, current was flowed in a track width direction of the sensor film, and anomalous Hall voltage generated in an element height direction was extracted by the electrodes 11a and 11b. As a comparative example, an element was produced, in which electrodes were disposed in an opposite manner to the example so that current was flowed in an element height direction of the sensor film, and anomalous Hall voltage generated in a track width direction was extracted. As a result, a better characteristic was obtained in a configuration of the example.

In the comparative example, obtained voltage corresponding to change in anomalous Hall voltage had a large noise component, and element sensitivity was degraded compared with that in the example. It is considered that the reason for this is because terminals for flowing current through the element are close to a medium surface, causing increase in noise component.

As described hereinbefore, the magnetic reproducing element of the invention enables improvement in reproduction sensitivity by optimizing saturation magnetization, perpendicular magnetic anisotropic energy per unit volume, and thickness of a sensor film.

The magnetic reproducing element using the perpendicular magnetization film according to the invention may exceed the limit of narrow-track reproduction sensitivity in the previous element using the in-plane magnetization film. In the magnetic reproducing element of the invention, since current is not flowed in a direction perpendicular to a plane of a sensor film unlike TMR or CPP-GMR, spin torque noise does not occur, and consequently high SNR can be achieved. Moreover, the magnetic reproducing element of the invention does not use the spin valve structure used in the previous TMR or GMR element, so that number of layers to be stacked can be reduced, and consequently improvement in production efficiency can be expected.

Figure 13:
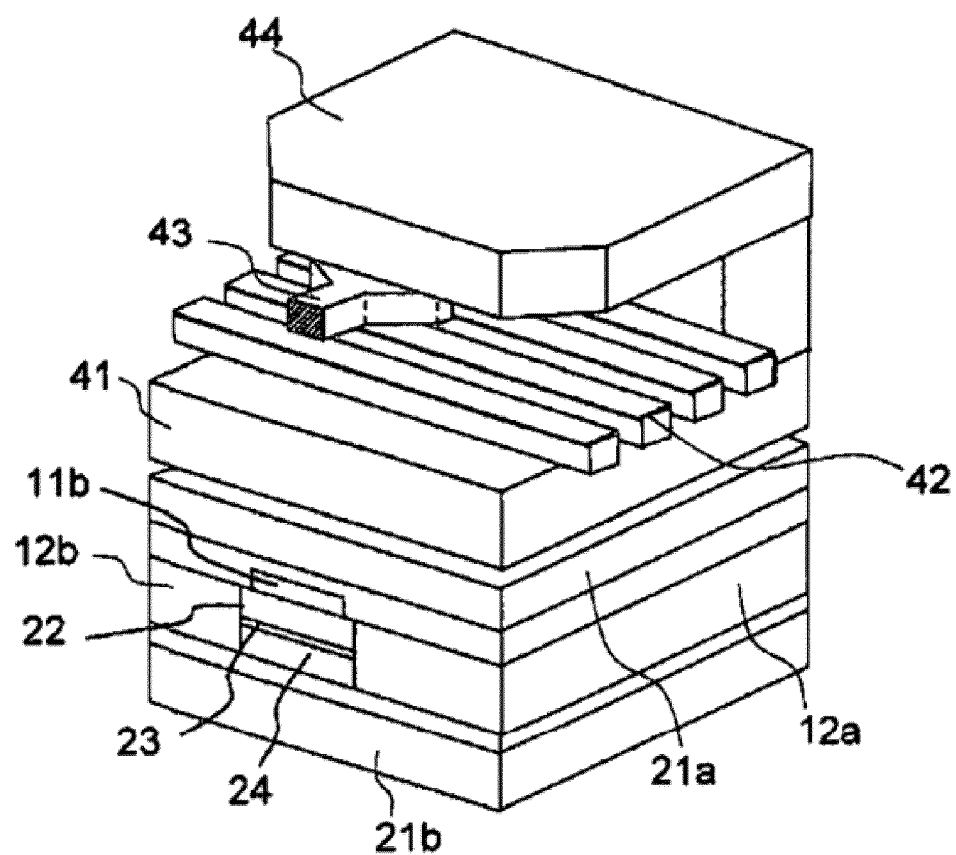
FIG. 13 is a schematic view of a magnetic head, according to one embodiment.

FIG. 13 is a conceptual view of a magnetic head mounted with the magnetic reproducing element according to the invention. The figure shows an example of a recording/reproducing separated magnetic head for perpendicular recording. The horizontal-bias magnetic reproducing element shown in FIG. 11 is used as a reproducing head, and a perpendicular recording head including a sub pole 41, a coil 42, a main pole 43, and a yoke section 44 is formed above the reproducing head. The invention relates to a magnetic reproducing element, and therefore even if a recording head includes either a perpendicular recording head or an in-plane recording head, the invention may be used. However, the magnetic reproducing element of the invention is combined with a perpendicular recording head, which allows more effective functions to be achieved.

Figure 14:
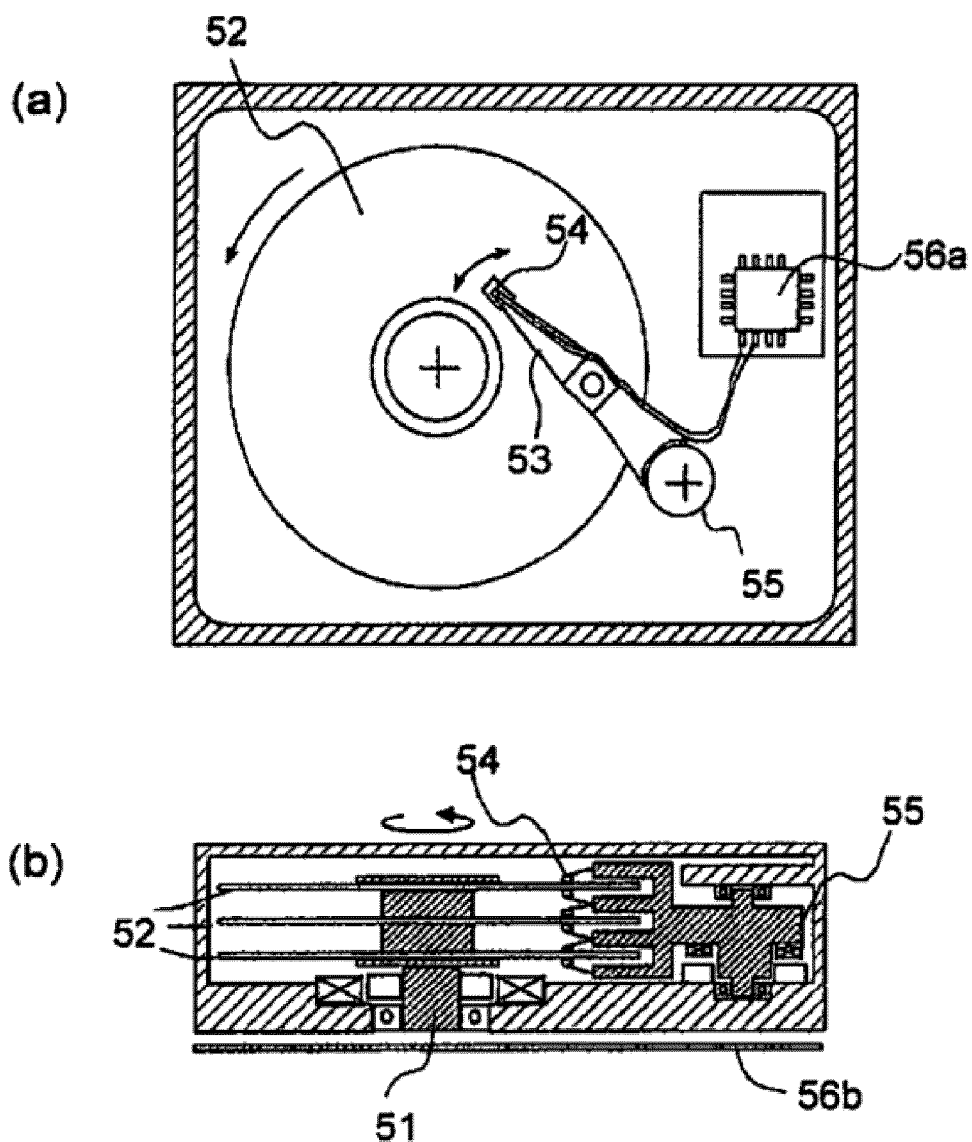
FIG. 14 is a schematic view of a magnetic storage device, according to one embodiment.

FIG. 14 is a conceptual view of a magnetic recording/reproducing device. The magnetic recording/reproducing device performs recording and reproducing of a magnetization signal by a magnetic head mounted on a slider 54 fixed to a tip of a suspension arm 53 at a predetermined position on a magnetic disk 52 rotated by a motor 51. A rotary actuator 55 is driven, so that a position in a radial direction of the magnetic disk (track) of the magnetic head can be selected. A write signal into the magnetic head and a read signal from the magnetic head are processed by a signal processing circuits 56a and 56b.

The following list is a description of the reference numerals and signs, and is provided for quick reference to the references consistent throughout the various figures included herein.

10: current
11a, 11b: voltage electrode
11e, 11d: voltage electrode terminal
12a, 12b: current electrode
14: bias magnetic field
21a: upper shield
21b: lower shield
22: sensor film
22a: spontaneous magnetization of sensor film
22b: perpendicular magnetization component of sensor film
22c: thickness of sensor film
23: insulating layer
24: bias layer
24a: magnetization of bias layer
30: magnetic recording medium
31: free layer
31a: magnetization of free layer
32: pinning layer
32a: magnetization of pinning layer
33: intermediate layer
35: element width
36: track width
37: magnetic field from medium
41: sub pole
42: coil
43: main pole
44: yoke section
51: motor
52: magnetic disk
53: suspension arm
54: slider
55: rotary actuator
56a, 56b: signal processing circuit While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A magnetic reproducing element for detecting a magnetic field from a magnetic recording medium, comprising:
   a sensor film including a perpendicular magnetization film having a magnetization easy axis in a direction perpendicular to a film plane, wherein a height of the sensor film in a direction perpendicular to a medium-facing surface of the sensor film is greater than a width of the sensor film at the medium-facing surface in a track width direction; and
   a pair of voltage terminals for measuring a change in anomalous Hall voltage generated in the sensor film,
   wherein magnetization in the sensor film tilts upward or downward in an element height direction from the magnetization easy axis while no magnetic field is applied from the magnetic recording medium, and
   wherein the change in anomalous Hall voltage generated in the sensor film is related to the magnetic field applied from the magnetic recording medium.

2. The magnetic reproducing element according to claim 1, further comprising:
   a bias film for applying a bias magnetic field in an in-plane direction of the sensor film; and
   an insulating film positioned between the bias film and the sensor film,
   wherein the bias film is an in-plane magnetization film positioned adjacent to the insulating film.

3. The magnetic reproducing element according to claim 1, wherein the magnetization easy axis is parallel to the medium-facing surface in a direction perpendicular to the track width direction.

4. The magnetic reproducing element according to claim 1, wherein the pair of voltage terminals are coupled on a common side of the sensor film.

5. A magnetic reproducing element, comprising:
   a sensor film including a perpendicular magnetization film, wherein a height of the sensor film in a direction perpendicular to a medium-facing surface of the sensor film is greater than a width of the sensor film at the medium-facing surface in a track width direction;
   a bias film for applying a bias magnetic field in an in-plane direction of the sensor film;
   a pair of current terminals for flowing a current through the sensor film; and
   a pair of voltage terminals for measuring a voltage generated in the sensor film and changes in anomalous Hall voltage,
   wherein upon application of an external magnetic field in the in-plane direction of the sensor film, a change in a perpendicular magnetization component of the sensor film is detected as change in the anomalous Hall voltage and is caused by rotation of magnetization in the sensor film.

6. The magnetic reproducing element according to claim 5, wherein the bias film is an in-plane magnetization film adjacent to or stacked on the sensor film, and
   wherein the sensor film has a structural characteristic such that when a first external magnetic field in the same direction as the bias magnetic field and a second external magnetic field in a direction opposite to the bias magnetic field are separately applied, the first and second external magnetic fields having the same field strength, a magnetization rotation angle caused by applying the first external magnetic field is larger than a magnetization rotation angle caused by applying the second external magnetic field.

7. The magnetic reproducing element according to claim 5, wherein the bias magnetic field is applied in a direction parallel to a height direction of the sensor film in a plane of the sensor film, the height direction is perpendicular to the medium-facing surface.

8. The magnetic reproducing element according to claim 5, wherein an insulating film is provided between the sensor film and the bias film.

9. The magnetic reproducing element according to claim 5, wherein the pair of current terminals are placed in a direction parallel to the medium-facing surface, and wherein the pair of voltage terminals are placed in a direction perpendicular to the medium-facing surface.

10. The magnetic reproducing element according to claim 5, wherein the pair of voltage terminals are coupled on a common side of the sensor film.

11. A magnetic head having:
   a recording element for generating a recording magnetic field to a magnetic recording medium; and
   a magnetic reproducing element for detecting a magnetic field from the magnetic recording medium, the magnetic reproducing element including:
      a sensor film including a perpendicular magnetization film, wherein a height of the sensor film in a direction perpendicular to a medium-facing surface of the sensor film is greater than a width of the sensor film at the medium-facing surface in a track width direction;
      a bias film for applying a bias magnetic field in an in-plane direction of the sensor film;
      a pair of current terminals for flowing a current through the sensor film; and
      a pair of voltage terminals for measuring a voltage generated in the sensor film,
      wherein magnetization in the sensor film tilts upward or downward in an element height direction from a magnetization easy axis without a magnetic field being applied from a magnetic recording medium; and
   wherein upon application of the magnetic field from the magnetic recording medium in the in-plane direction of the sensor film, a change in a perpendicular magnetization component of the sensor film is detected as change in anomalous Hall voltage, the change being caused by rotation of magnetization in the sensor film.

* * * * *

UNITED STATES PATENT AND TRADEMARK OFFICE
CERTIFICATE OF CORRECTION

PATENT NO. : 8,390,954 B2  
APPLICATION NO. : 12/556492  
DATED : March 5, 2013  
INVENTOR(S) : Das et al.

Page 1 of 1

It is certified that error appears in the above-identified patent and that said Letters Patent is hereby corrected as shown below:

In the specification:

col. 3, line 22 replace "Magnetic" with --magnetic--;

col. 6, line 19 replace "spill" with --spin--;

col. 6, line 48 replace "1" with --I--;

col. 7, line 59 replace "11e" with --11c--;

col. 13, line 63 replace "11e" with --11c--.

Signed and Sealed this  
Twenty-first Day of May, 2013

Teresa Stanek Rea  
*Acting Director of the United States Patent and Trademark Office*